(12) United States Patent
Lee et al.

(10) Patent No.: US 12,113,545 B2
(45) Date of Patent: Oct. 8, 2024

(54) CAPACITOR DIGITAL-TO-ANALOG CONVERTER USING RANDOM RESET SIGNAL AND INTEGRATED CIRCUIT INCLUDING THE SAME

(71) Applicant: SAMSUNG ELECTRONICS CO., LTD., Suwon-si (KR)

(72) Inventors: Yanghoon Lee, Hwaseong-si (KR); Wan Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 149 days.

(21) Appl. No.: 17/872,173

(22) Filed: Jul. 25, 2022

(65) Prior Publication Data

US 2023/0128228 A1 Apr. 27, 2023

(30) Foreign Application Priority Data

Oct. 22, 2021 (KR) ........................ 10-2021-0141706

(51) Int. Cl.
*H03M 1/12* (2006.01)
*H03M 1/68* (2006.01)
*H03M 1/80* (2006.01)

(52) U.S. Cl.
CPC ............. *H03M 1/802* (2013.01); *H03M 1/68* (2013.01)

(58) Field of Classification Search
CPC ...... H03M 1/46; H03M 1/1215; H03M 1/468; H03M 1/804; H03M 1/66; H03M 3/43; H03M 3/464; H03M 1/466; H03M 1/0641; H03M 1/462; H03M 1/747; H03M 3/332; H03M 3/502; H03M 1/0673

USPC .................. 341/118–120, 144, 150, 172
See application file for complete search history.

(56) References Cited

U.S. PATENT DOCUMENTS

| 3,789,377 | A | * | 1/1974 | Norris | ................. | G11B 20/1419 |
| 4,574,271 | A | * | 3/1986 | Yada | ........................ | H03M 1/52 |
| | | | | | | 341/118 |
| 5,404,142 | A | * | 4/1995 | Adams | ................. | H03M 1/0668 |
| | | | | | | 341/118 |
| 6,201,835 | B1 | * | 3/2001 | Wang | ....................... | H03M 3/34 |
| | | | | | | 375/247 |
| 6,462,685 | B1 | * | 10/2002 | Korkala | .............. | H03M 3/3287 |
| | | | | | | 341/131 |

(Continued)

FOREIGN PATENT DOCUMENTS

| KR | 1183876 A | 2/2012 |
| KR | 1603892 B1 | 3/2016 |

*Primary Examiner* — Linh V Nguyen
(74) *Attorney, Agent, or Firm* — Fish & Richardson P.C.

(57) ABSTRACT

A capacitor digital-to-analog converter (CDAC) includes a clock generator, a random reset control signal generator, a first capacitor array, a first reset circuit and an output buffer. The clock generator generates an internal clock signal and a reset control signal that are regularly toggled. The random reset control signal generator generates a random reset control signal that is irregularly toggled. The first capacitor array includes a plurality of capacitors connected to a first summation node, and generates a first summation voltage corresponding to a first input digital signal based on first and second reference voltages. The first reset circuit initializes the first summation node based on the random reset control signal. The output buffer generates a first analog output voltage by buffering the first summation voltage.

20 Claims, 12 Drawing Sheets

(56) References Cited

U.S. PATENT DOCUMENTS

| | | | |
|---|---|---|---|
| 6,690,147 B2* | 2/2004 | Bonto | G05F 1/575 |
| | | | 323/280 |
| 6,906,653 B2 | 6/2005 | Uno | |
| 6,956,519 B1* | 10/2005 | Huang | H03M 1/0863 |
| | | | 341/172 |
| 6,970,120 B1* | 11/2005 | Bjornsen | H03M 3/38 |
| | | | 341/120 |
| 7,928,880 B2* | 4/2011 | Tsukamoto | H03M 1/1061 |
| | | | 341/144 |
| 9,496,885 B2 | 11/2016 | Takayama | |
| 9,774,811 B1* | 9/2017 | Ebihara | H03K 4/502 |
| 9,998,138 B1* | 6/2018 | Wang | H03M 1/1215 |
| 10,735,016 B2 | 8/2020 | Nakamura et al. | |
| 10,979,065 B1* | 4/2021 | Chang | H03M 1/66 |
| 11,074,493 B2 | 7/2021 | Danjo et al. | |
| 2007/0013566 A1* | 1/2007 | Chuang | H03M 3/34 |
| | | | 341/143 |
| 2012/0280841 A1* | 11/2012 | Wang | H03M 1/1295 |
| | | | 341/172 |
| 2017/0033800 A1* | 2/2017 | Yuan | H03M 1/1245 |
| 2020/0195269 A1* | 6/2020 | Lei | H03M 1/468 |
| 2021/0111734 A1* | 4/2021 | Zhang | H03M 3/50 |

* cited by examiner

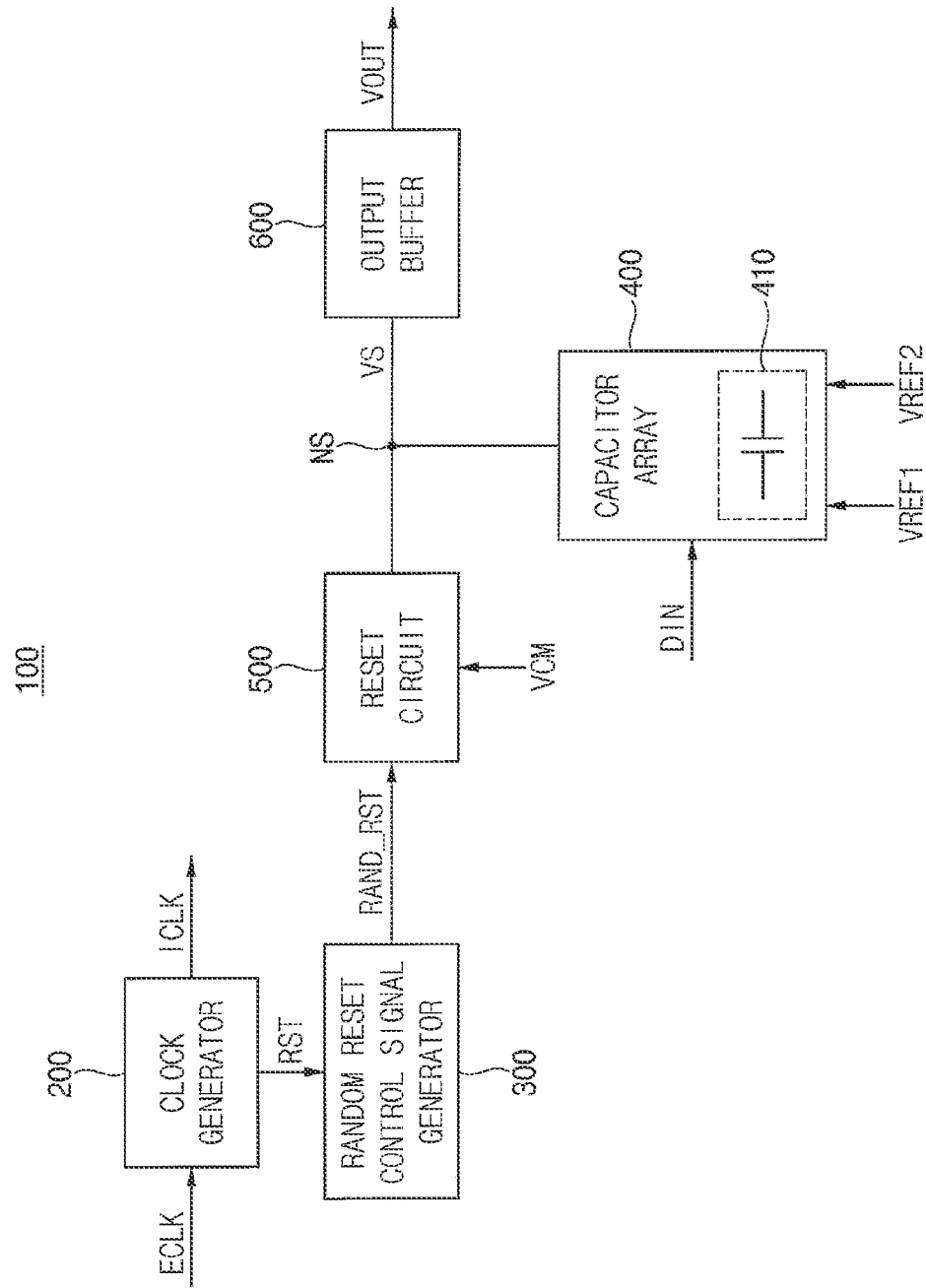

FIG. 9
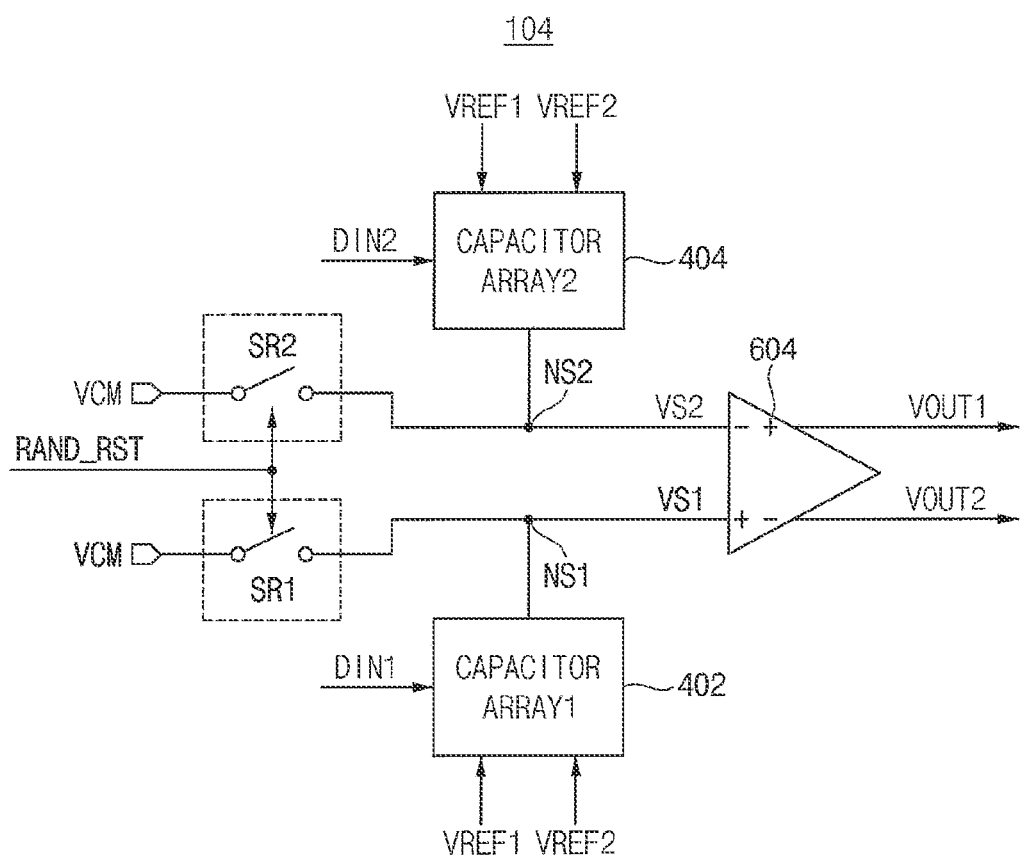
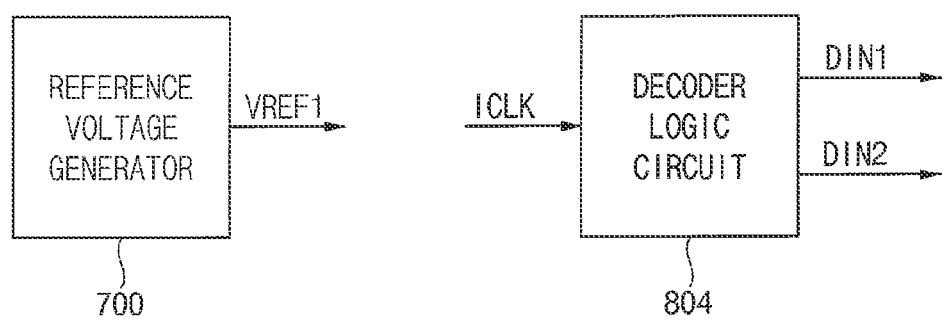

CAPACITOR DIGITAL-TO-ANALOG CONVERTER USING RANDOM RESET SIGNAL AND INTEGRATED CIRCUIT INCLUDING THE SAME

CROSS-REFERENCE TO RELATED APPLICATION

This application claims priority under 35 USC § 119 to Korean Patent Application No. 10-2021-0141706 filed on Oct. 22, 2021 and to Korean Patent Application No. 10-2021-0188090 filed on Dec. 27, 2021 in the Korean Intellectual Property Office (KIPO), the contents of which are herein incorporated by reference in their entirety.

BACKGROUND

1. Technical Field

Exemplary embodiments relate generally to semiconductor integrated circuits, and more particularly to capacitor digital-to-analog converters (CDACs) using random reset signals, and integrated circuits including the capacitor digital-to-analog converters.

2. Description of the Related Art

A digital-to-analog converter (DAC) is a device that generates an analog signal from an inputted digital signal. The DAC may be used in a variety of applications including data communications (including voice, video, etc.), measurement and testing devices, and data telemetry devices.

In order to realize the DAC on a complementary metal oxide semiconductor (CMOS) device, general use is made of a voltage-scaling type DAC in which a plurality of resistors for dividing a voltage are connected in series between two reference voltages, and a divided voltage corresponding to input digital data is selected and output. However, this DAC exhibits a deficiency in the fact that, in a high bit, variation in the value of resistance deteriorates integral linearity. In contrast, use is made of a charge-scaling type DAC in which a divided voltage between two reference voltages is output by use of a plurality of binary-weighted capacitors whose capacitance values have a ratio of, for example, 1:2:4 making use of the potential in the ratio precision of capacitance values in a CMOS device.

SUMMARY OF THE INVENTION

At least one exemplary embodiment of the present disclosure provides a capacitor digital-to-analog converter (CDAC) capable of minimizing glitches while reducing signal dependency during a reset phase.

At least one exemplary embodiment of the present disclosure provides an integrated circuit including the capacitor digital-to-analog converter.

According to exemplary embodiments, a capacitor digital-to-analog converter (CDAC) includes a clock generator, a random reset control signal generator, a first capacitor array, a first reset circuit and an output buffer. The clock generator generates an internal clock signal and a reset control signal based on an external clock signal. The internal clock signal is regularly toggled. The reset control signal is regularly toggled. The random reset control signal generator generates a random reset control signal based on the reset control signal. The random reset control signal is irregularly toggled. The first capacitor array includes a plurality of capacitors, and generates a first summation voltage based on a first reference voltage and a second reference voltage. The plurality of capacitors in the first capacitor array are connected to a first summation node and have different capacitances. The first summation voltage corresponds to a first input digital signal. The first reset circuit initializes the first summation node based on the random reset control signal and a change in the first input digital signal. The output buffer generates a first analog output voltage by buffering the first summation voltage.

According to exemplary embodiments, an integrated circuit includes an internal circuit and a capacitor digital-to-analog converter (CDAC). The capacitor digital-to-analog converter performs a digital-to-analog conversion on at least one of an input and an output of the internal circuit. The capacitor digital-to-analog converter includes a clock generator, a random reset control signal generator, a first capacitor array, a first reset circuit and an output buffer. The clock generator generates an internal clock signal and a reset control signal based on an external clock signal. The internal clock signal is regularly toggled. The reset control signal is regularly toggled. The random reset control signal generator generates a random reset control signal based on the reset control signal. The random reset control signal is irregularly toggled. The first capacitor array includes a plurality of capacitors, and generates a first summation voltage based on a first reference voltage and a second reference voltage. The plurality of capacitors in the first capacitor array are connected to a first summation node and have different capacitances. The first summation voltage corresponds to a first input digital signal. The first reset circuit initializes the first summation node based on the random reset control signal and a change in the first input digital signal. The output buffer generates a first analog output voltage by buffering the first summation voltage.

According to exemplary embodiments, a capacitor digital-to-analog converter (CDAC) includes a clock generator, a random reset control signal generator, a capacitor array, a reference voltage generator, a decoder logic circuit, a reset circuit and an output buffer. The clock generator generates an internal clock signal and a reset control signal based on an external clock signal. The internal clock signal is regularly toggled during a reset phase and a conversion phase. The reset control signal is regularly toggled during the reset phase and has a deactivation state during the conversion phase. The random reset control signal generator generates a random reset control signal based on the internal clock signal and the reset control signal. The random reset control signal is irregularly toggled during the reset phase and has a deactivation state during the conversion phase. The capacitor array generates a summation voltage corresponding to an input digital signal based on a reference voltage and a ground voltage, and includes first to N-th capacitors and first to N-th switches, where N is a natural number greater than or equal to two. The first to N-th capacitors are connected to a summation node and have different capacitances. The first to N-th switches are connected to the first to N-th capacitors. The reference voltage generator generates the reference voltage, and includes a decoupling capacitor. The decoder logic circuit generates the input digital signal based on the internal clock signal. The reset circuit initializes the summation node based on a reset voltage, the random reset control signal and a change in the input digital signal during the reset phase. The output buffer generates an analog output voltage by buffering the summation voltage. During the reset phase, a value of the input digital signal sequentially increases based on the internal clock signal, a voltage level of the summation voltage is initialized to a voltage level of the reset voltage in response to the random reset control signal having an activation state, and the voltage level of the summation voltage sequentially increases based on the input digital signal in response to the random reset control signal having the deactivation state. During the conversion phase, the input digital signal has a target value for a digital-to-analog conversion, and the summation voltage has a target voltage level corresponding to the target value.

In the capacitor digital-to-analog converter and the integrated circuit according to exemplary embodiments, the reset operation may be performed during the reset phase based on the random reset control signal. The random reset control signal may be irregularly toggled during the reset phase, and rising edges and/or falling edges of the random reset control signal may be irregularly (e.g., randomly) generated. Thus, glitches due to the reset operation may randomly occur, and a specific frequency component due to a periodic glitch may not occur. Accordingly, the glitches may be minimized while reducing the signal dependence by performing the reset operation, and the capacitor digital-to-analog converter may have improved or enhanced performance (e.g., SNR characteristic).

BRIEF DESCRIPTION OF THE DRAWINGS

Illustrative, non-limiting exemplary embodiments will be more clearly understood from the following detailed description taken in conjunction with the accompanying drawings.

FIG. 1 is a block diagram illustrating a capacitor digital-to-analog converter according to exemplary embodiments.

FIG. 9 is a diagram illustrating another example of a capacitor digital-to-analog converter of FIG. 1.

DETAILED DESCRIPTION OF THE PREFERRED EMBODIMENTS

Figure 2A:
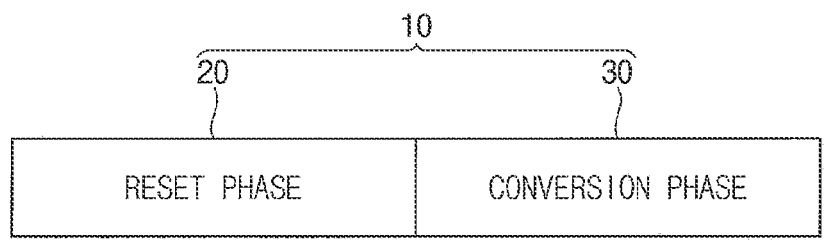
FIGS. 2A and 2B are diagrams for describing an operation of a capacitor digital-to-analog converter according to exemplary embodiments.

Various exemplary embodiments will be described more fully with reference to the accompanying drawings, in which such embodiments are shown. The present disclosure may, however, be embodied in many different forms and should not be construed as limited to the embodiments set forth herein. Like reference numerals refer to like elements throughout this application.

FIG. 1 is a block diagram illustrating a capacitor digital-to-analog converter according to exemplary embodiments.

Referring to FIG. 1, a capacitor digital-to-analog converter or a capacitor-based digital-to-analog converter (CDAC) 100 includes a clock generator 200, a random reset control signal generator 300, a capacitor array 400, a reset circuit 500 and an output buffer 600.

The clock generator 200 generates an internal clock signal ICLK and a reset control signal RST based on an external clock signal ECLK. The internal clock signal ICLK is regularly or periodically toggled, and the reset control signal RST is regularly or periodically toggled.

The external clock signal ECLK may be supplied externally of the capacitor digital-to-analog converter 100. For example, although not illustrated in detail, an external oscillator that is disposed or located externally of the capacitor digital-to-analog converter 100 may generate the external clock signal ECLK, and may provide the external clock signal ECLK to the clock generator 200. For example, the external oscillator may include a ring oscillator, an RC oscillator, a crystal oscillator, or a temperature compensated crystal oscillator (TCXO), but exemplary embodiments are not limited thereto.

The internal clock signal ICLK may be used as a driving clock for operating components included in the capacitor digital-to-analog converter 100. For example, although not illustrated in detail, the internal clock signal ICLK may be provided to at least one of the random reset control signal generator 300, the capacitor array 400, the reset circuit 500 and the output buffer 600. For example, the internal clock signal ICLK may be used during a sampling operation of the capacitor digital-to-analog converter 100, and may be referred to as a sampling clock signal. For example, the internal clock signal ICLK may be always regularly toggled or swung while the capacitor digital-to-analog converter 100 normally operates. The internal clock signal ICLK may have a deactivation state without being toggled while the capacitor digital-to-analog converter 100 does not normally operate (e.g., in a power off mode or a low power mode).

The reset control signal RST may be used to generate a random reset control signal RAND_RST that is used to perform a reset operation (or initialization operation) of the capacitor digital-to-analog converter 100. Unlike the internal clock signal ICLK, the reset control signal RST may be regularly toggled or swung during a specific operation phase (or period) while the capacitor digital-to-analog converter 100 normally operates, and may have a deactivation state without being toggled during another specific operation phase while the capacitor digital-to-analog converter 100 normally operates. The reset control signal RST may have the deactivation state without being toggled while the capacitor digital-to-analog converter 100 does not normally operate.

The random reset control signal generator 300 generates the random reset control signal RAND_RST based on the reset control signal RST. The random reset control signal RAND_RST is irregularly, randomly or aperiodically toggled. A configuration of the random reset control signal generator 300 will be described with reference to FIGS. 3 and 4.

Unlike the reset control signal RST, the random reset control signal RAND_RST may be irregularly toggled or swung in the specific operation phase while the capacitor digital-to-analog converter 100 normally operates, and may have a deactivation state without being toggled during another specific operation phase while the capacitor digital-to-analog converter 100 normally operates. The random reset control signal RAND_RST may have the deactivation state without being toggled while the capacitor digital-to-analog converter 100 does not normally operate.

An operation of the capacitor digital-to-analog converter 100 and examples of the external clock signal ECLK, the internal clock signal ICLK, the reset control signal RST and the random reset control signal RAND_RST will be described with reference to FIGS. 2A and 2B.

The capacitor array 400 includes a plurality of capacitors 410 that are connected to a summation node NS and have different capacitances. The capacitor array 400 generates a summation voltage VS corresponding to an input digital signal DIN based on a first reference voltage VREF1 and a second reference voltage VREF2. For example, the capacitor array 400 may provide the summation voltage VS to the summation node NS based on charging and discharging of the plurality of capacitors 410. For example, one of the first reference voltage VREF1 and the second reference voltage VREF2 may be a ground voltage. A configuration of the capacitor array 400 will be described with reference to FIG. 6.

In some exemplary embodiments, as will be described with reference to FIG. 6, the capacitor digital-to-analog converter 100 may further include a reference voltage generator that generates at least one of the first reference voltage VREF1 and the second reference voltage VREF2. In some exemplary embodiments, as will be described with reference to FIG. 6, the capacitor digital-to-analog converter 100 may further include a decoder logic circuit that generates the input digital signal DIN.

The reset circuit 500 initializes the summation node NS based on the random reset control signal RAND_RST and a change in the input digital signal DIN. For example, the reset circuit 500 may receive a reset voltage VCM, and may initialize a voltage level of the summation voltage VS at the summation node NS to a voltage level of the reset voltage VCM based on the random reset control signal RAND_RST and the change in the input digital signal DIN. A configuration of the reset circuit 500 will be described with reference to FIG. 6.

The output buffer 600 generates an analog output voltage VOUT by buffering the summation voltage VS.

In some exemplary embodiments, as will be described with reference to FIG. 6, the analog output voltage VOUT may include a single-ended signal, and the capacitor digital-to-analog converter 100 may include one capacitor array and one reset circuit. In other exemplary embodiments, as will be described with reference to FIG. 9, the analog output voltage VOUT may include a pair of differential signals, and the capacitor digital-to-analog converter 100 may include two capacitor arrays and two reset circuits.

Figure 2B:
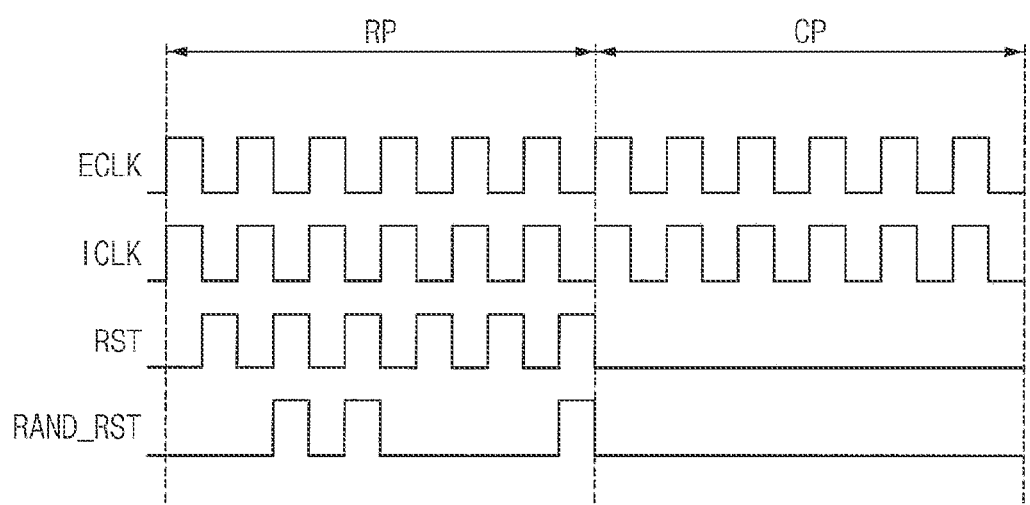

FIGS. 2A and 2B are diagrams for describing an operation of a capacitor digital-to-analog converter according to exemplary embodiments.

Referring to FIG. 2A, a normal operation interval during which the capacitor digital-to-analog converter 100 normally operates may include a reset phase 20 and a conversion phase 30 subsequent to the reset phase 20.

During the reset phase 20, the capacitor digital-to-analog converter 100 may perform the reset operation, and may initialize the summation node NS using the reset circuit 500. For example, as will be described with reference to FIG. 7B, during the reset phase 20, a value of the input digital signal DIN may sequentially increase based on the internal clock signal ICLK, and the voltage level of the summation voltage VS at the summation node NS may be initialized to the voltage level of the reset voltage VCM when the random reset control signal RAND_RST has the deactivation state. Based on the above-described reset operation, the signal dependence may be reduced, and performance may be improved or enhanced.

During the conversion phase 30 subsequent to the reset phase 20, the capacitor digital-to-analog converter 100 may perform a digital-to-analog conversion operation. For example, during the conversion phase 30, the input digital signal DIN may have a target value to be converted for the digital-to-analog conversion operation, and the summation voltage VS that is generated based on the input digital signal DIN may have a target voltage level corresponding to the target value.

Referring to FIG. 2B, examples of the internal clock signal ICLK and the reset control signal RST that are generated from the clock generator 200 based on the external clock signal ECLK are illustrated, and an example of the random reset control signal RAND_RST that is generated from the random reset control signal generator 300 based on the reset control signal RST is illustrated.

The external clock signal ECLK that is supplied from the outside may always be regularly toggled regardless of the operation of the capacitor digital-to-analog converter 100. Here, the toggling of the external clock signal ECLK may represent that rising edges and falling edges of the external clock signal ECLK are repeated, and thus activation states and deactivation states of the external clock signal ECLK are repeated. In addition, the regular toggling of the external clock signal ECLK may represent that the rising edges and the falling edges of the external clock signal ECLK are regularly or periodically repeated, and thus the activation states and the deactivation states of the external clock signal ECLK are regularly or periodically repeated. For example, the activation state may correspond to a first logic level (e.g., a logic high level), and the deactivation state may correspond to a second logic level (e.g., a logic low level) different from the first logic level.

The internal clock signal ICLK that is generated based on the external clock signal ECLK may always be regularly toggled during a reset phase RP and a conversion phase CP. For example, as illustrated in FIG. 2B, the internal clock signal ICLK may have a frequency, phase and duty ratio substantially the same as those of the external clock signal ECLK. However, exemplary embodiments are not limited thereto, and at least one of the frequency, phase and duty ratio of the internal clock signal ICLK may be different from those of the external clock signal ECLK.

The reset control signal RST that is generated based on the external clock signal ECLK may be regularly toggled during the reset phase RP, and may have the deactivation state during the conversion phase CP. For example, as illustrated in FIG. 2B, during the reset phase RP, the reset control signal RST may have a frequency and duty ratio substantially the same as those of the external clock signal ECLK (e.g., substantially the same as those of the internal clock signal ICLK), and may have a phase opposite to that of the external clock signal ECLK (e.g., opposite to that of the internal clock signal ICLK). For example, the phase of the internal clock signal ICLK and the phase of the reset control signal RST may be opposite to each other, and the reset control signal RST may be generated by inverting the internal clock signal ICLK. However, exemplary embodiments are not limited thereto, and at least one of the frequency and duty ratio of the reset control signal RST may be different from those of the external clock signal ECLK.

The random reset control signal RAND_RST that is generated based on the reset control signal RST may be irregularly toggled during the reset phase RP, and may have the deactivation state during the conversion phase CP. For example, as illustrated in FIG. 2B, during the reset phase RP, the random reset control signal RAND_RST may have a frequency, phase and duty ratio different from those of the reset control signal RST. For example, a sum of lengths of intervals in which the random reset control signal RAND_RST has activation state and a sum of lengths of intervals in which the random reset control signal RAND_RST has the deactivation state may be different from each other. An operation of generating the random reset control signal RAND_RST will be described with reference to FIG. 5.

The capacitor digital-to-analog converter 100 may include the plurality of capacitors 410 having different capacitances, may generate a divided voltage between the two reference voltages VREF1 and VREF2 by charging and discharging the plurality of capacitors 410 by a switching operation based on the input digital signal DIN, and may generate the analog output signal VOUT based on the divided voltage. The capacitor digital-to-analog converter 100 may be referred to as a switched-capacitor (SC) digital-to-analog converter, a charge-scaling digital-to-analog converter, or the like.

For the capacitor digital-to-analog converter 100 to have high spurious-free dynamic range (SFDR) and high signal-to-noise ratio (SNR) within a predetermined band, the reference voltages VREF1 and VREF2 should be stable while the plurality of capacitors 410 included in the capacitor digital-to-analog converter 100 performs the switching operation.

Conventionally, a glitch occurring on the reference voltages VREF1 and VREF2 was minimized using a decoupling capacitor. Typically, one of the reference voltages VREF1 and VREF2 may be a ground voltage, the other of the reference voltages VREF1 and VREF2 may be a positive reference voltage. When the positive reference voltage is to be generated, the decoupling capacitor may be connected to an output terminal outputting the positive reference voltage, and thus the glitch occurring on the positive reference voltage may be reduced by the reset operation performed during the reset phase 20.

Conventionally, the reset operation was performed by periodically initializing the summation node NS using a control signal (e.g., the reset control signal RST) that is regularly toggled. Thus, the glitch periodically occurred on the positive reference voltage, and there was a problem in that an undesired frequency component occurs on an output (e.g., the analog output signal VOUT) due to the glitch.

In a system with high performance, a capacitor digital-to-analog converter with high performance may be required, and a driving frequency of the capacitor digital-to-analog converter may increase. For example, to support a wireless Bluetooth (WLBT) modem, a capacitor digital-to-analog converter with a resolution of about 10 bits or more and a driving frequency of about 100 MHz or more may be required. In this case, a period of the reset operation may be shortened, and thus the occurrence of glitches may increase. It may be difficult to completely eliminate or reduce the glitches using only the decoupling capacitor. If a capacitance of the decoupling capacitor increases to eliminate or reduce the glitches, there may be a problem in that a size of the decoupling capacitor increases and thus a size of a chip increases.

In the capacitor digital-to-analog converter 100 according to exemplary embodiments, the reset operation may be performed during the reset phase 20 based on the random reset control signal RAND_RST. The random reset control signal RAND_RST may be irregularly toggled during the reset phase 20, and rising edges and/or falling edges of the random reset control signal RAND_RST may be irregularly (e.g., randomly) generated. Thus, the glitch due to the reset operation may randomly occur, and a specific frequency component due to a periodic glitch may not occur. Accordingly, the glitch may be minimized while reducing signal dependence by performing the reset operation, and the capacitor digital-to-analog converter 100 may have improved or enhanced performance (e.g., SNR characteristic).

Hereinafter, an operation of the capacitor digital-to-analog converter 100 according to exemplary embodiments will be described with a focus on an operation during the reset phase 20.

Figure 3:
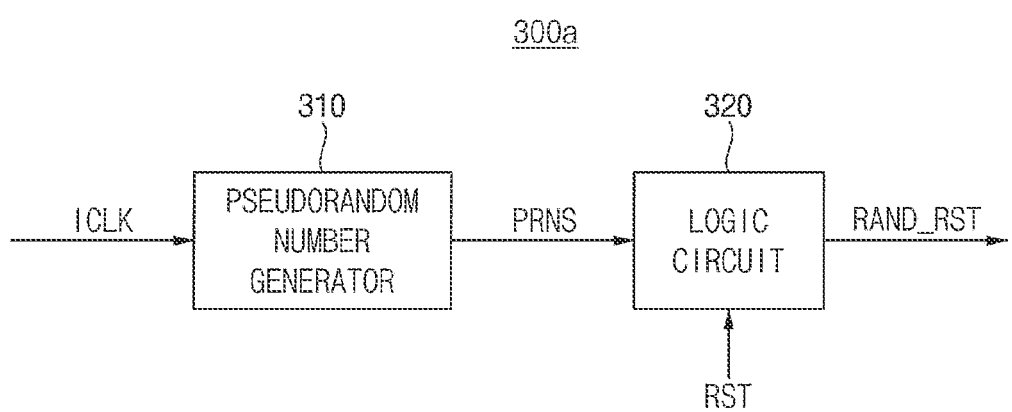
FIG. 3 is a block diagram illustrating an example of a random reset control signal generator included in a capacitor digital-to-analog converter of FIG. 1.

FIG. 3 is a block diagram illustrating an example of a random reset control signal generator included in a capacitor digital-to-analog converter of FIG. 1.

Referring to FIG. 3, a random reset control signal generator 300a may include a pseudorandom number generator (PRNG) 310 and a logic circuit 320.

The pseudorandom number generator 310 may generate a pseudorandom number signal PRNS based on the internal clock signal ICLK. For example, the pseudo random number signal PRNS may be generated in synchronization with rising edges of the internal clock signal ICLK.

A pseudorandom number generator, also known as a deterministic random bit generator (DRBG), is an algorithm for generating a sequence of numbers whose properties approximate the properties of sequences of random numbers. A sequence generated by the pseudorandom number generator is determined by an initial value, called a seed (which may include truly random values). The pseudorandom number generator may be central in applications such as simulations (e.g., for the Monte Carlo method), electronic games (e.g. for procedural generation), and cryptography.

The logic circuit 320 may generate the random reset control signal RAND_RST based on the pseudorandom number signal PRNS and the reset control signal RST. For example, the logic circuit 320 may include at least one logic gate.

Figure 4:
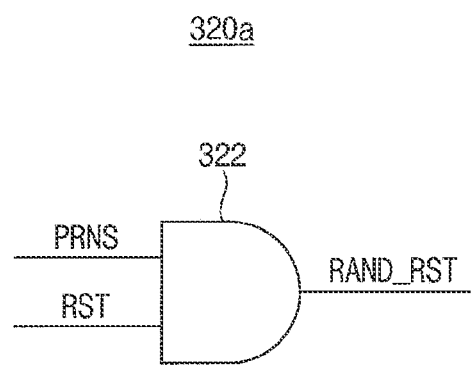
FIG. 4 is a block diagram illustrating an example of a logic circuit included in a random reset control signal generator of FIG. 3.

FIG. 4 is a block diagram illustrating an example of a logic circuit included in a random reset control signal generator of FIG. 3.

Referring to FIG. 4, the logic circuit 320a may include an AND gate 322. The AND gate 322 may generate the random reset control signal RAND_RST by performing an AND operation on the pseudorandom number signal PRNS and the reset control signal RST. However, exemplary embodiments are not limited thereto, and a configuration of the logic circuit 320 may be variously determined according to exemplary embodiments.

Figure 5:
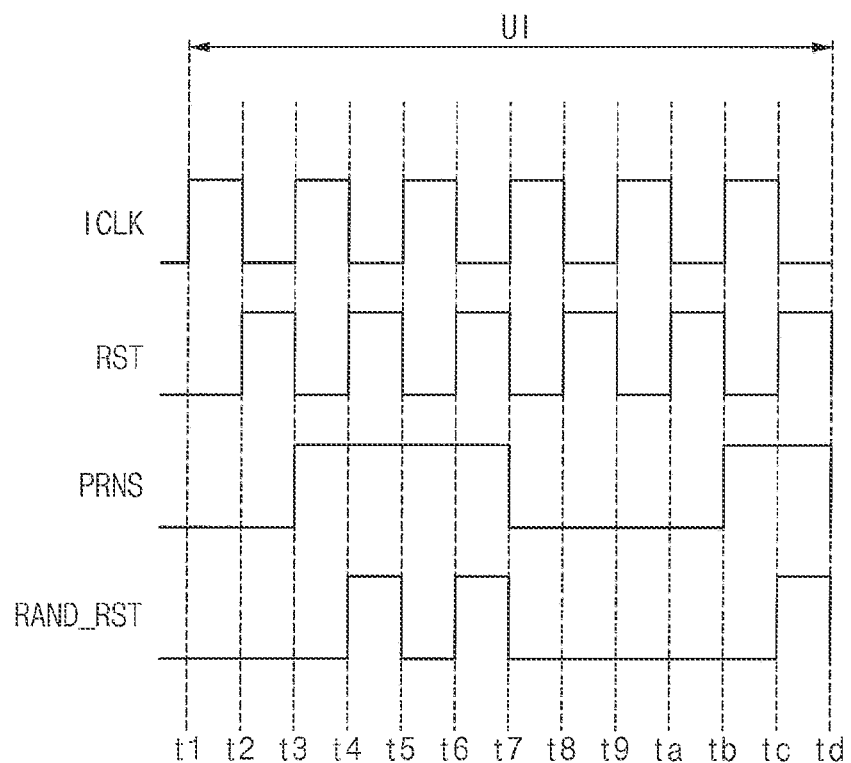
FIG. 5 is a diagram for describing an operation of a random reset control signal generator of FIG. 3.

FIG. 5 is a diagram for describing an operation of a random reset control signal generator of FIG. 3.

Referring to FIG. 5, an operation of the random reset control signal generator 300a during the reset phase 20 is illustrated, and examples of the internal clock signal ICLK, the reset control signal RST, the pseudorandom number signal PRNS and the random reset control signal RAND_RST during the reset phase 20 are illustrated.

The internal clock signal ICLK may have rising edges at time points t1, t3, t5, t7, t9 and tb, and may have falling edges at time points t2, t4, t6, t8, ta and tc. Thus, the internal clock signal ICLK may have the activation states during a time interval from time point t1 to time point t2, a time interval from time point t3 to time point t4, a time interval from time point t5 to time point t6, a time interval from time point t7 to time point t8, a time interval from time point t9 to time point ta, and a time interval from time point tb to time point tc. A time interval having the activation state may be defined as an activation period. In addition, the internal clock signal ICLK may have the deactivation states during a time interval from time point t2 to time point t3, a time interval from time point t4 to time point t5, a time interval from time point t6 to time point t7, a time interval from time point t8 to time point t9, a time interval from time point ta to time point tb, and a time interval from time point tc to time point td. A time interval having the deactivation state may be defined as a deactivation period.

Similarly, the reset control signal RST may have rising edges at time points t2, t4, t6, t8, ta and tc, and may have falling edges at time points t3, t5, t7, t9, tb, and td. Thus, the reset control signal RST may have the activation states during a time interval from time point t2 to time point t3, a time interval from time point t4 to time point t5, a time interval from time point t6 to time point t7, a time interval from time point t8 to time point t9, a time interval from time point ta to time point tb, and a time interval from time point tc to time point td. In addition, the reset control signal RST may have the deactivation states during a time interval from time point t1 to time point t2, a time interval from time point t3 to time point t4, a time interval from time point t5 to time point t6, a time interval from time point t7 to time point t8, a time interval from time point t9 to time point ta, and a time interval from time point tb to time point tc.

The pseudorandom number signal PRNS may have rising edges and falling edges in synchronization with the rising edges of the internal clock signal ICLK, and the rising edges and the falling edges of the pseudorandom number signal PRNS may be irregularly (e.g., randomly or aperiodically) generated. For example, the pseudorandom number signal PRNS may have the rising edges at time points t3 and tb, and may have the falling edges at time points t7 and td. Thus, the pseudorandom number signal PRNS may have activation states during a time interval from time point t3 to time point t7, and a time interval from time point tb to time point td. In addition, the pseudorandom number signal PRNS may have deactivation states during a time interval from time point t1 to time point t3, and a time interval from time point t7 to time point tb.

The random reset control signal RAND_RST may be generated by performing an AND operation on the pseudorandom number signal PRNS and the reset control signal RST. Thus, the random reset control signal RAND_RST may have the activation state only when both the pseudorandom number signal PRNS and the reset control signal RST have the activation state. For example, the random reset control signal RAND_RST may have the activation states during a time interval from time point t4 to time point t5, a time interval from time point t6 to time point t7, and a time interval from time point tc to time point td. In addition, the random reset control signal RAND_RST may have the deactivation states during a time interval from time point t1 to time point t4, a time interval from time point t5 to time point t6, and a time interval from time point t7 to time point tc. Thus, the random reset control signal RAND_RST may have rising edges at time points t4, t6 and tc, and may have falling edges at time points t5, t7 and td. The rising edges and the falling edges of the random reset control signal RAND_RST may be irregularly (e.g., randomly or aperiodically) generated.

In some exemplary embodiments, as illustrated in FIG. 5, a duty ratio of the internal clock signal ICLK and a duty ratio of the reset control signal RST may be about 50:50. In this example, during a unit interval UI in the reset phase 20, a sum of lengths of first activation periods in which the reset control signal RST has the activation state and a sum of lengths of first deactivation periods in which the reset control signal RST has the deactivation state may be substantially equal to each other. In addition, during the unit interval UI in the reset phase 20, a sum of lengths of second activation periods in which the random reset control signal RAND_RST has the activation state and a sum of lengths of second deactivation periods in which the random reset control signal RAND_RST has the deactivation state may be different from each other.

For example, the sum of the lengths of the first activation periods may correspond to a sum of the time interval from time point t2 to time point t3, the time interval from time point t4 to time point t5, the time interval from time point t6 to time point t7, the time interval from time point t8 to time point t9, the time interval from time point ta to time point tb, and the time interval from time point tc to time point td. In addition, the sum of the lengths of the first deactivation periods may correspond to a sum of the time interval from time point t1 to time point t2, the time interval from time point t3 to time point t4, the time interval from time point t5 to time point t6, the time interval from time point t7 to time point t8, the time interval from time point t9 to time point ta, and the time interval from time point tb to time point tc.

For example, the sum of the lengths of the second activation periods may correspond to a sum of the time interval from time point t4 to time point t5, the time interval from time point t6 to time point t7, and the time interval from time point tc to time point td. In addition, the sum of the lengths of the second deactivation periods may correspond to a sum of the time interval from time point t1 to time point t4, the time interval from time point t5 to time point t6, and the time interval from time point t7 to time point tc.

As described above, when the random reset control signal RAND_RST is used in which the rising edges and the falling edges are irregularly generated and the sum of the lengths of the second activation periods and the sum of the lengths of the second deactivation periods are different from each other, the glitch caused by the reset operation may be minimized The reset operation will be described with reference to FIGS. 7A and 7B.

Figure 6:
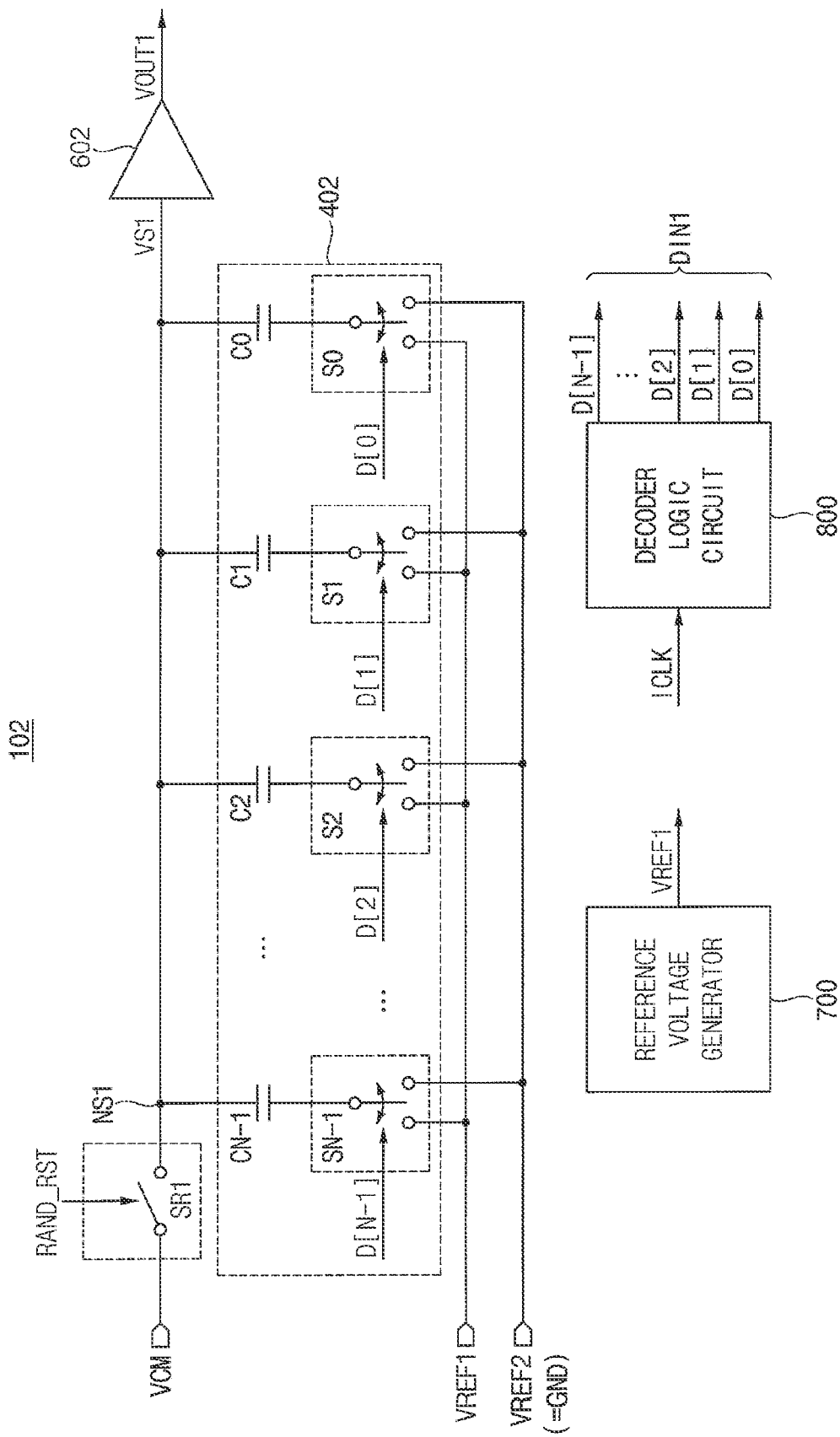
FIG. 6 is a diagram illustrating an example of a capacitor digital-to-analog converter of FIG. 1.

FIG. 6 is a diagram illustrating an example of a capacitor digital-to-analog converter of FIG. 1.

Referring to FIG. 6, a capacitor digital-to-analog converter 102 may include a first capacitor array 402, a first reset circuit and an output buffer 602, and may further include a reference voltage generator 700 and a decoder logic circuit 800. For convenience of illustration, configurations corresponding to the clock generator 200 and the random reset control signal generator 300 in FIG. 1 are omitted.

The first capacitor array 402 may correspond to the capacitor array 400 in FIG. 1. The first capacitor array 402 may include first to N-th capacitors C0, C1, C2, . . . , CN−1, and first to N-th switches S0, S1, S2, . . . , SN−1, where N is a natural number greater than or equal to two.

The first to N-th capacitors C0, C1, C2, . . . , CN−1 may be connected to a first summation node NS1, may be charged and discharged based on a first input digital signal DIN1, the first reference voltage VREF1 and the second reference voltage VREF2, and may provide a first summation voltage VS1 to the first summation node NS1. The first input digital signal DIN1 may include first to N-th bits D[0], D[1], D[2], ..., D[N−1]. The first summation node NS1, the first input digital signal DIN1 and the first summation voltage VS1 may correspond to the summation node NS, the input digital signal DIN and the summation voltage VS in FIG. 1, respectively.

In some exemplary embodiments, capacitances of the first to N-th capacitors C0, C1, C2, ..., CN−1 may be different from each other. For example, a capacitance of a K-th capacitor may increase as K increases, where K is a natural number greater than or equal to one and less than or equal to N. For example, the first capacitor C0 may have the smallest capacitance among the first to N-th capacitors C0, C1, C2, ..., CN−1, the second capacitor C1 may have the capacitance larger than that of the first capacitor C0, the third capacitor C2 may have the capacitance larger than that of the second capacitor C2, and the N-th capacitor CN−1 may have the largest capacitance among the first to N-th capacitors C0, C1, C2, ..., CN−1.

In some exemplary embodiments, a capacitance of a (K+1)-th capacitor may be about twice the capacitance of the K-th capacitor. For example, the capacitance of the second capacitor C1 may be about twice the capacitance of the first capacitor C0. The capacitance of the third capacitor C2 may be about twice the capacitance of the second capacitor C1, and may be about $4(=2^2)$ times the capacitance of the first capacitor C0. The capacitance of the N-th capacitor CN−1 may be about $2^{(N-1)}$ times the capacitance of the first capacitor C0. In other words, a capacitance ratio of the first to N-th capacitors C0, C1, C2, ..., CN−1 may be about $1:2:4: \ldots :2^{(N-1)}$. In this example, the first capacitor array 402 may be referred to as a binary-weighted capacitor array.

The first to N-th switches S0, S1, S2, ..., SN−1 may be connected to the first to N-th capacitors C0, C1, C2, ..., CN−1, respectively. The first to N-th switches S0, S1, S2, ..., SN−1 may apply one of the first reference voltage VREF1 and the second reference voltage VREF2 to the first to N-th capacitors C0, C1, C2, ..., CN−1 based on the bits D[0], D[1], D[2], ..., D[N−1] of the first input digital signal DIN1.

The first to N-th capacitors C0, C1, C2, ..., CN−1 may be charged based on one of the first reference voltage VREF1 and the second reference voltage VREF2 that are provided through the first to N-th switches S0, S1, S2, ..., SN−1, and may be discharged based on the other of the first reference voltage VREF1 and the second reference voltage VREF2. For example, the first reference voltage VREF1 may be a positive reference voltage, and the second reference voltage VREF2 may be a ground voltage GND. In this example, the first to N-th capacitors C0, C1, C2, ..., CN−1 may be charged based on the first reference voltage VREF1, and may be discharged based on the second reference voltage VREF2 (e.g., the ground voltage GND).

For example, the first switch S0 may provide one of the first reference voltage VREF1 and the second reference voltage VREF2 to the first capacitor C0 based on the first bit D[0] of the first input digital signal DIN1. When the first bit D[0] has a first value (e.g., '1'), the first switch S0 may provide the first reference voltage VREF1 to the first capacitor C0, and the first capacitor C0 may be charged based on the first reference voltage VREF1. When the first bit D[0] has a second value (e.g., '0') different from the first value, the first switch S0 may provide the second reference voltage VREF2 to the first capacitor C0, and the first capacitor C0 may be discharged based on the second reference voltage VREF2.

Similarly, the second switch S1 may provide one of the first reference voltage VREF1 and the second reference voltage VREF2 to the second capacitor C1 based on the second bit D[1] of the first input digital signal DIN1. Depending on a value of the second bit D[1], the second capacitor C1 may be charged based on the first reference voltage VREF1 provided through the second switch S1, and may be discharged based on the second reference voltage VREF2 provided through the second switch S1. The third switch S2 may provide one of the first reference voltage VREF1 and the second reference voltage VREF2 to the third capacitor C2 based on the third bit D[2] of the first input digital signal DIN1. Depending on a value of the third bit D[2], the third capacitor C2 may be charged based on the first reference voltage VREF1 provided through the third switch S2, and may be discharged based on the second reference voltage VREF2 provided through the third switch S2. The N-th switch SN−1 may provide one of the first reference voltage VREF1 and the second reference voltage VREF2 to the N-th capacitor CN−1 based on the N-th bit D[N−1] of the first input digital signal DIN1. Depending on a value of the N-th bit D[N−1], the N-th capacitor CN−1 may be charged based on the first reference voltage VREF1 provided through the N-th switch SN−1, and may be discharged based on the second reference voltage VREF2 provided through the N-th switch SN−1.

Although FIG. 6 illustrates that each of the first to N-th switches S0, S1, S2, ..., SN−1 is a single-pole double-throw (SPDT) switch, exemplary embodiments are not limited thereto, and each of the first to N-th switches S0, S1, S2, ..., SN−1 may include two transistors or two transmission gates and the like.

The first reset circuit may correspond to the reset circuit 500 in FIG. 1. The first reset circuit may include a switch SR1. The switch SR1 may be connected between the reset voltage VCM and the first summation node NS1, and may be turned on and off based on the random reset control signal RAND_RST. For example, the switch SR1 may be a single-pole single-throw (SPST) switch, and may include one transistor or one transfer gate.

For example, when the random reset control signal RAND_RST has the activation state (e.g., the first logic level or the logic high level), the switch SR1 may be turned on and closed, and the voltage level of the first summation voltage VS1 at the first summation node NS1 may be initialized to the voltage level of the reset voltage VCM. When the random reset control signal RAND_RST has the deactivation state (e.g., the second logic level or the logic low level), the switch SR1 may be turned off and opened, and the voltage level of the first summation voltage VS1 at the first summation node NS1 may have a voltage level corresponding to charges that are provided from the first to N-th capacitors C0, C1, C2, ..., CN−1 charged based on the first input digital signal DIN1 and the first reference voltage VREF1.

The output buffer 602 may correspond to the output buffer 600 in FIG. 1. The output buffer 602 may generate a first analog output voltage VOUT1 by buffering the first summation voltage VS1. For example, the first analog output voltage VOUT1 may be a single-ended signal.

The reference voltage generator 700 may generate the first reference voltage VREF1. A configuration of the reference voltage generator 700 will be described with reference to FIG. 8.

The decoder logic circuit 800 may generate the first input digital signal DIN1 including first to N-th bits D[0], D[1], D[2], ..., D[N−1] based on the internal clock signal ICLK. For example, the first input digital signal DIN1 may be generated (e.g., sampled) in synchronization with the rising edges of the internal clock signal ICLK. For example, the first input digital signal DIN1 may be an N-bit digital signal, and the capacitor digital-to-analog converter 102 may be an N-bit digital-to-analog converter that converts an N-bit digital signal into an analog voltage. For example, the first bit D[N−1] may be a least significant bit (LSB) of the first input digital signal DIN1, and the N-th bit D[N−1] may be a most significant bit (MSB) of the first input digital signal DIN1.

Figure 7A:
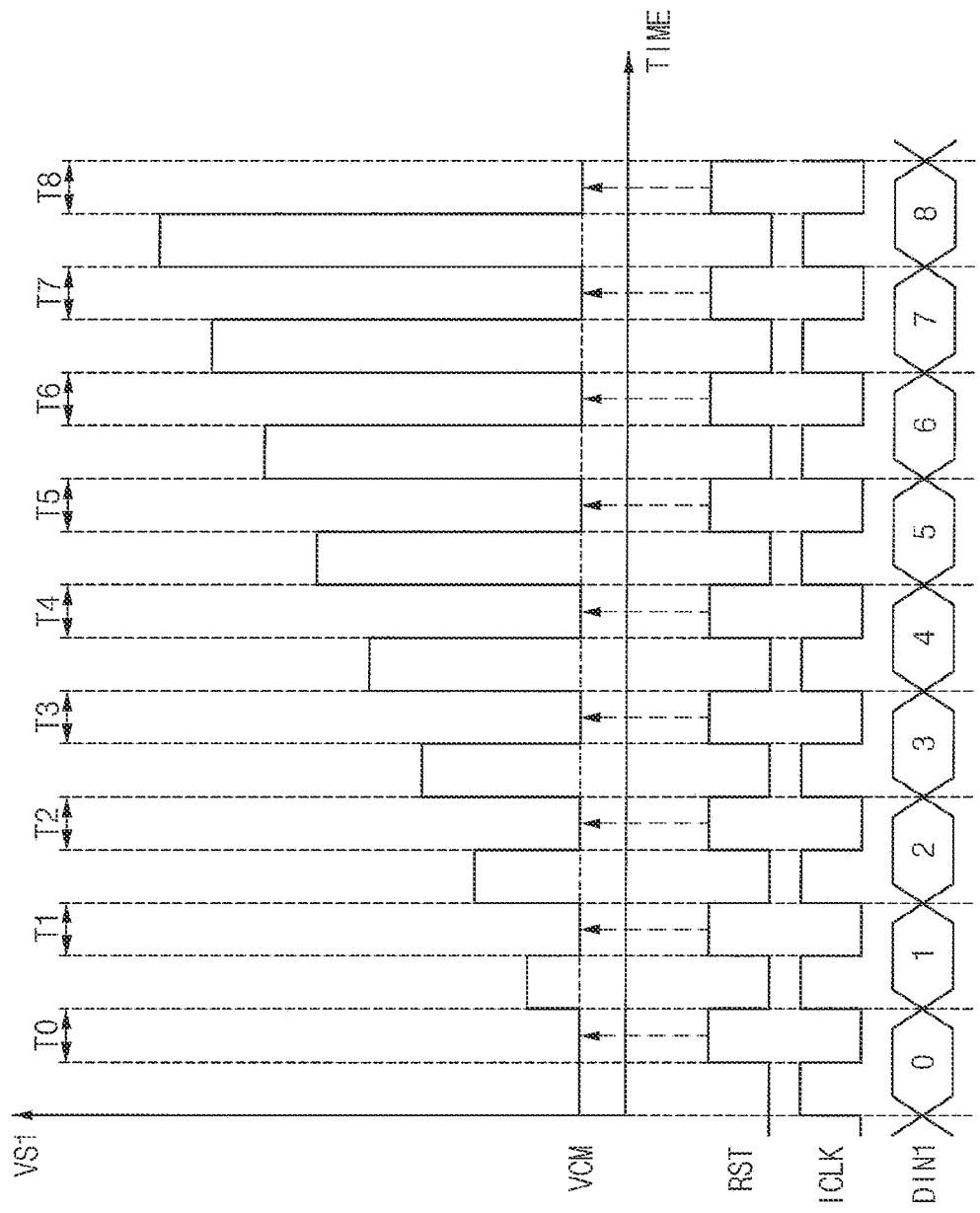
FIGS. 7A and 7B are diagrams for describing the operation of a capacitor digital-to-analog converter of FIG. 6.
Figure 7B:
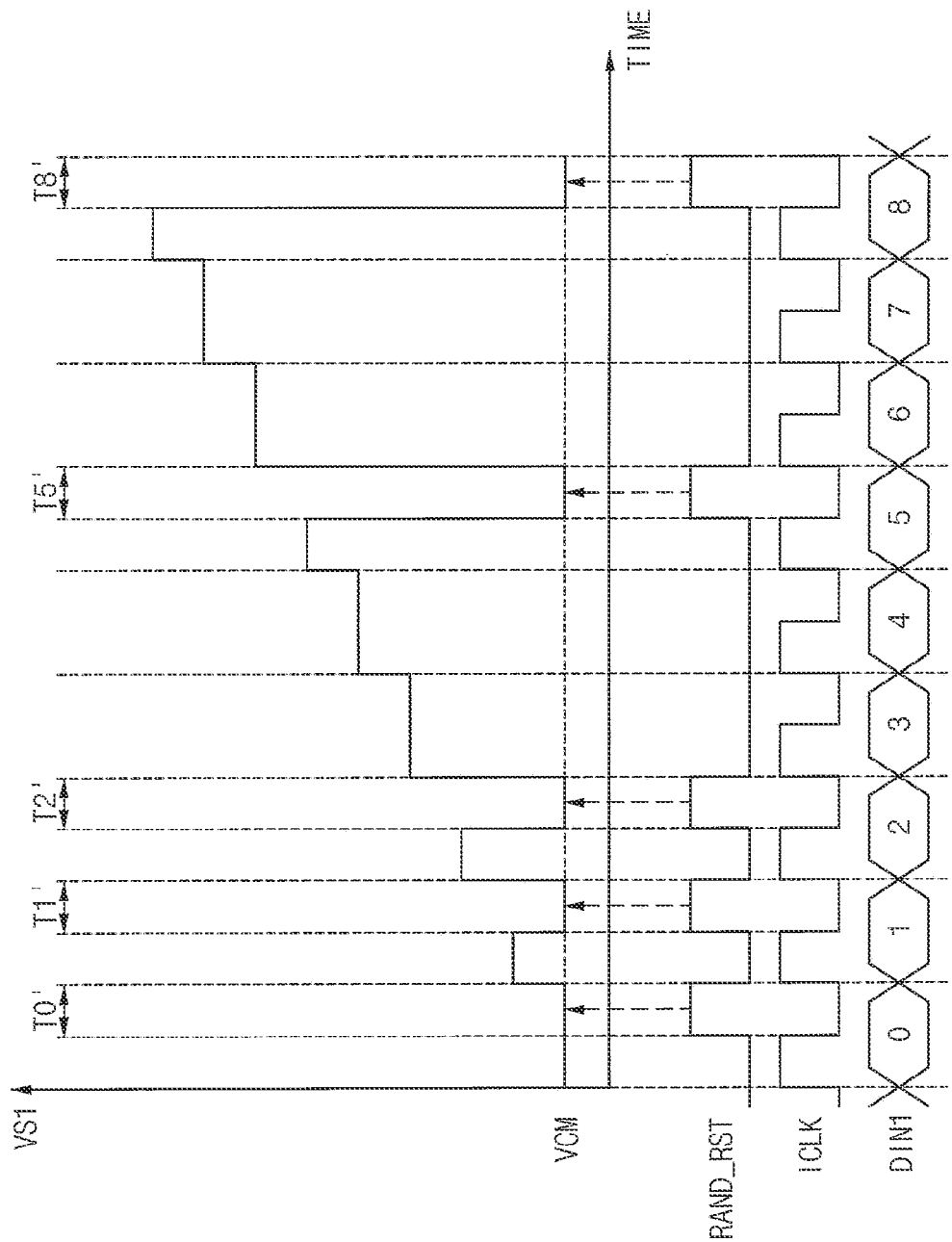

FIGS. 7A and 7B are diagrams for describing an operation of a capacitor digital-to-analog converter of FIG. 6.

Referring to FIG. 7A, a conventional reset operation in which the first summation node NS1 is initialized during the reset phase 20 using the reset control signal RST that is regularly toggled is illustrated.

During the reset phase 20, the value of the first input digital signal DIN1 may sequentially increase based on the internal clock signal ICLK (e.g., in synchronization with the rising edges of the internal clock signal ICLK). For example, the value of the first input digital signal DIN1 may be '0' at the first rising edge of the internal clock signal ICLK, may increase to '1' at the second rising edge of the internal clock signal ICLK, may increase to '2' at the third rising edge of the internal clock signal ICLK, and may sequentially increase by one, such as '3', '4', '5', '6', '7', '8', ..., whenever the rising edge of the internal clock signal ICLK appears. For example, when the first input digital signal DIN1 is a 10-bit digital signal (e.g., when N=10), '0', '1', '2', '3', '4', '5', '6', '7', '8', ... in decimal may be represented as '0000000000', '0000000001', '0000000010', '0000000011', '0000000100', '0000000101', '0000000110', '0000000111', '0000001000', ... in binary, and the value of the first input digital signal DIN1 may sequentially increase from '0' to '$2^{10}$-1' (e.g., from '0000000000' to '1111111111').

During the reset phase 20, the reset control signal RST may have a phase opposite to that of the internal clock signal ICLK.

When the reset control signal RST has the deactivation state, e.g., during the first deactivation periods described with reference to FIG. 5, the voltage level of the first summation voltage VS1 at the first summation node NS1 may be a voltage level corresponding to charges that are provided from the first to N-th capacitors C0, C1, C2, ..., CN−1 charged based on the first input digital signal DIN1 and the first reference voltage VREF1. Since the value of the first input digital signal DIN1 sequentially increases, the voltage level of the first summation voltage VS1 may also sequentially increase.

For example, when the value of the first input digital signal DIN1 is '0', all of the first to N-th bits D[0], D[1], D[2], ..., D[N−1] of the first input digital signal DIN1 may be '0'. In this example, all of the first to N-th capacitors C0, C1, C2, ..., CN−1 may not be charged, there may be no charges provided from the first to N-th capacitors C0, C1, C2, ..., CN−1, and thus the voltage level of the first summation voltage VS1 may be substantially equal to the voltage level of the reset voltage VCM.

When the value of the first input digital signal DIN1 is '1', the first bit D[0] of the first input digital signal DIN1 may be '1', and the remaining bits of the first input digital signal DIN1 may be '0'. In this example, only the first capacitor C0 may be charged, charges may be provided from the first capacitor C0, and thus the voltage level of the first summation voltage VS1 may increase from the voltage level of the reset voltage VCM by a voltage level corresponding to the amount of charges provided from the first capacitor C0.

When the value of the first input digital signal DIN1 is '2', the second bit D[1] of the first input digital signal DIN1 may be '1', and the remaining bits of the first input digital signal DIN1 may be '0'. In this example, only the second capacitor C1 may be charged, charges may be provided from the second capacitor C1, and thus the voltage level of the first summation voltage VS1 may increase from the voltage level of the reset voltage VCM by a voltage level corresponding to the amount of charge provided from the second capacitor C1. For example, the capacitance of the second capacitor C1 may be about twice the capacitance of the first capacitor C0, and thus a difference between the voltage level of the first summation voltage VS1 and the voltage level of the reset voltage VCM when the value of the first input digital signaled DIN1 is '2' may be about twice a difference between the voltage level of the first summation voltage VS1 and the voltage level of the reset voltage VCM when the value of the first input digital signal DIN1 is '1'.

When the value of the first input digital signal DIN1 is '3', the first bit D[0] and the second bit D[1] of the first input digital signal DIN1 may be '1', and the remaining bits of the first input digital signal DIN1 may be '0'. In this example, the first capacitor C0 and the second capacitor C1 may be charged, charges may be provided from the first capacitor C0 and the second capacitor C1, and thus the voltage level of the first summation voltage VS1 may increase from the voltage level of the reset voltage VCM by a voltage level corresponding to the amount of charges provided from the first capacitor C0 and the second capacitor C1.

When the value of the first input digital signal DIN1 is '4', the third bit D[2] of the first input digital signal DIN1 may be '1', and the remaining bits of the first input digital signal DIN1 may be '0'. In this example, only the third capacitor C2 may be charged, charges may be provided from the third capacitor C2, and thus the voltage level of the first summation voltage VS1 may increase from the voltage level of the reset voltage VCM by a voltage level corresponding to the amount of charges provided from the third capacitor C2. For example, the capacitance of the third capacitor C2 may be about 4 times the capacitance of the first capacitor C0, and thus a difference between the voltage level of the first summation voltage VS1 and the voltage level of the reset voltage VCM when the value of the first input digital signal DIN1 is '3' may be about 4 times a difference between the voltage level of the first summation voltage VS1 and the voltage level of the reset voltage VCM when the value of the first input digital signal DIN1 is '1'.

Similarly, when the value of the first input digital signal DIN1 is '5', the voltage level of the first summation voltage VS1 may increase from the voltage level of the reset voltage VCM by a voltage level corresponding to the amount of charges provided from the first capacitor C0 and the third capacitor C2. When the value of the first input digital signal DIN1 is '6', the voltage level of the first summation voltage VS1 may increase from the voltage level of the reset voltage VCM by a voltage level corresponding to the amount of charges provided from the second capacitor C1 and the third capacitor C2. When the value of the first input digital signal DIN1 is '7', the voltage level of the first summation voltage VS1 may increase from the voltage level of the reset voltage VCM by a voltage level corresponding to the amount of charges provided from the first capacitor C0, the second capacitor C1 and the third capacitor C2. When the value of the first input digital signal DIN1 is '8', the voltage level of the first summation voltage VS1 may increase from the voltage level of the reset voltage VCM by a voltage level corresponding to the amount of charges provided from the fourth capacitor (e.g., C3 which is not illustrated).

When the reset control signal RST has the activation states, e.g., during the first activation periods described with reference to FIG. 5, the voltage level of the first summation voltage VS1 at the first summation node NS1 may be initialized to the voltage level of the reset voltage VCM. In the conventional reset operation, the voltage level of the first summation voltage VS1 may be always initialized for every period in which the value of the first input digital signal DIN1 increases (e.g., for each sampling period). For example, the conventional reset operation may be performed during portions T0, T1, T2, T3, T4, T5, T6, T7, T8, . . . of all time intervals during which the value of the first input digital signal DIN1 is '0', '1', '2', '3', '4', '5', '6', '7', '8' . . . . Thus, there is a problem in that a sampling frequency component is included in the first summation voltage VS1.

Referring to FIG. 7B, the reset operation according to exemplary embodiments in which the first summation node NS1 is initialized during the reset phase 20 using the random reset control signal RAND_RST that is irregularly toggled is illustrated.

During the reset phase 20, the value of the first input digital signal DIN1 may sequentially increase based on the internal clock signal ICLK.

When the random reset control signal RAND_RST has the deactivation state, e.g., during the second deactivation periods described with reference to FIG. 5, the voltage level of the first summation voltage VS1 at the first summation node NS1 may be a voltage level corresponding to charges that are provided from the first to N-th capacitors C0, C1, C2, . . . , CN−1 charged based on the first input digital signal DIN1 and the first reference voltage VREF1. Since the value of the first input digital signal DIN1 sequentially increases, the voltage level of the first summation voltage VS1 may also sequentially increase.

When the random reset control signal RAND_RST has the activation state, e.g., during the second activation periods described with reference to FIG. 5, the voltage level of the first summation voltage VS1 at the first summation node NS1 may be initialized to the voltage level of the reset voltage VCM. Unlike the conventional reset operation of FIG. 7A, in the reset operation according to exemplary embodiments, the voltage level of the first summation voltage VS1 may be initialized only for some period in which the value of the first input digital signal DIN1 increases (e.g., only for some sampling period). For example, the reset operation according to exemplary embodiments may be performed during portions T0, T0', T1', T2', T5', T8' of some time intervals during which the value of the first input digital signal DIN1 is '0', '1', '2', '5', '8'.

In the capacitor digital-to-analog converter according to exemplary embodiments, during the reset phase 20, the first input digital signal DIN1 may be applied through the first to N-th switches S0, S1, S2, . . . , SN−1 based on a timing of the sampling clock signal (e.g., based on one activation state of the internal clock signal ICLK), and the first to N-th capacitors C0, C1, C2, . . . , CN−1 may be charged based thereon. Next, the switching operation may be performed based on the first input digital signal DIN1 having a changed (e.g., increased) value at a subsequent timing of the sampling clock signal (e.g., a subsequent activation state of the internal clock signal ICLK), and the first to N-th capacitors C0, C1, C2, . . . , CN−1 may be charged and discharged to correspond to the changed amount (e.g., the increased amount) of the first input digital signal DIN1. When the random reset control signal RAND_RST is activated during the above-described operation, the voltage level of the first summation voltage VS1 may be initialized to the voltage level of the reset voltage VCM, and the first to N-th capacitors C0, C1, C2, . . . , CN−1 may be charged based on the first input digital signal DIN1 at a subsequent sampling timing. The glitch may occur on the reference voltage (e.g., the first reference voltage VREF1) by charging and discharging the first to N-th capacitors C0, C1, C2, . . . , CN−1, however, the amount of glitches may be reduced and the glitches may randomly occur when the reset operation is performed based on the random reset control signal RAND_RST according to exemplary embodiments. Since a correlation between a magnitude of the digital signal and the amount of glitches is reduced and the glitches randomly occur, a sampling frequency component included in the first summation voltage VS1 may be eliminated or reduced.

Figure 8:
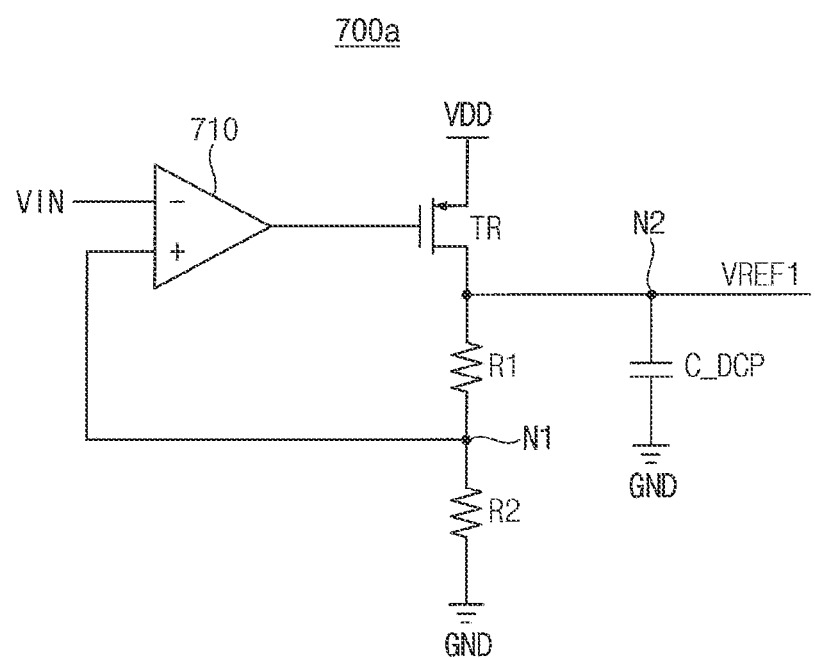
FIG. 8 is a block diagram illustrating an example of a reference voltage generator included in a capacitor digital-to-analog converter of FIG. 6.

FIG. 8 is a block diagram illustrating an example of a reference voltage generator included in a capacitor digital-to-analog converter of FIG. 6.

Referring to FIG. 8, a reference voltage generator 700a may include an amplifier 710, a transistor TR, resistors R1 and R2, and a decoupling capacitor C_DCP.

The amplifier 710 may include a first input terminal (e.g., a negative (−) input terminal) receiving an input voltage VIN, a second input terminal (e.g., a positive (+) input terminal) connected to a node N1, and an output terminal.

The transistor TR may be connected between a power supply voltage VDD and a node N2 outputting the first reference voltage VREF1, and may include a control electrode (e.g., a gate electrode) connected to the output terminal of the amplifier 710.

The resistors R1 and R2 may be connected in series between the transistor TR and a ground voltage GND. For example, the resistor R1 may be connected between the node N2 and the node N1, and the resistor R2 may be connected between the node N1 and the ground voltage GND.

The decoupling capacitor C_DCP may be connected between the node N2 and the ground voltage GND.

However, exemplary embodiments are not limited thereto, and a configuration of the reference voltage generator 700 may be variously determined according to such exemplary embodiments.

FIG. 9 is a diagram illustrating another example of a capacitor digital-to-analog converter of FIG. 1. The descriptions repeated with FIG. 6 will be omitted as redundant.

Referring to FIG. 9, a capacitor digital-to-analog converter 104 may include a first capacitor array 402, a second capacitor array 404, a first reset circuit, a second reset circuit and an output buffer 604, and may further include a reference voltage generator 700 and a decoder logic circuit 804. For convenience of illustration, configurations corresponding to the clock generator 200 and the random reset control signal generator 300 in FIG. 1 are omitted.

The first capacitor array 402 and the second capacitor array 404 may correspond to the capacitor array 400 in FIG. 1. The first reset circuit and the second reset circuit may correspond to the reset circuit 500 in FIG. 1. The output buffer 604 may correspond to the output buffer 600 in FIG. 1.

The first capacitor array 402 may be substantially the same as the first capacitor array 402 in FIG. 6, and may be connected to the first summation node NS1. The first capacitor array 402 may include N capacitors that are charged and discharged based on the first input digital signal DIN1, the first reference voltage VREF1 and the second reference voltage VREF2 to provide the first summation voltage VS1 to the first summation node NS1, and N switches that provide one of the first reference voltage VREF1 and the second reference voltage VREF2 to the N capacitors based on the first input digital signal DIN1.

The second capacitor array 404 may have a configuration substantially the same as that of the first capacitor array 402, and may be connected to a second summation node NS2. The second capacitor array 404 may include N capacitors that are charged and discharged based on a second input digital signal DIN2, the first reference voltage VREF1 and the second reference voltage VREF2 to provide a second summation voltage VS2 to the second summation node NS2, and N switches that provide one of the first reference voltage VREF1 and the second reference voltage VREF2 to the N capacitors based on the second input digital signal DIN2.

The first reset circuit may be substantially the same as the first reset circuit in FIG. 6, and may include the switch SR1. The second reset circuit may have a configuration substantially the same as that of the first reset circuit, and may include a switch SR2. The switch SR2 may be connected between the reset voltage VCM and the second summation node NS2, and may be turned on and off based on the random reset control signal RAND_RST.

The output buffer 604 may generate the first analog output voltage VOUT1 and a second analog output voltage VOUT2 by buffering the first summation voltage VS1 and the second summation voltage VS2. For example, the first analog output voltage VOUT1 and the second analog output voltage VOUT2 may be a pair of differential signals.

The reference voltage generator 700 may be substantially the same as the reference voltage generator 700 in FIG. 6, and may generate the first reference voltage VREF1.

The decoder logic circuit 804 may be similar to the decoder logic circuit 800 in FIG. 6, and may generate the first input digital signal DIN1 and the second input digital signal DIN2 based on the internal clock signal ICLK. For example, the second input digital signal DIN2 may be obtained by inverting the first input digital signal DIN1. In other words, the first input digital signal DIN1 and the second input digital signal DIN2 may have an inverse relationship with each other.

Figure 10:
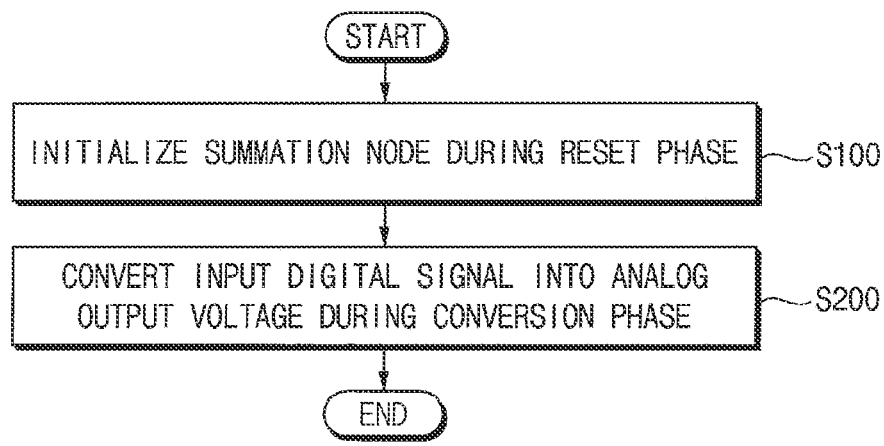
FIG. 10 is a flowchart illustrating a method of operating a capacitor digital-to-analog converter according to exemplary embodiments.

FIG. 10 is a flowchart illustrating a method of operating a capacitor digital-to-analog converter according to exemplary embodiments.

Referring to FIGS. 1, 2A and 10, in a method of operating a capacitor digital-to-analog converter according to exemplary embodiments, the summation node NS is initialized during the reset phase 20 (step S100). For example, step S100 may be performed by the clock generator 200, the random reset control signal generator 300, the capacitor array 400 and the reset circuit 500, and may be performed as described with reference to FIG. 7B.

The input digital signal DIN is converted into the analog output voltage VOUT during the conversion phase 30 after the reset phase 20 (step S200). For example, step S200 may be performed by the clock generator 200, the capacitor array 400 and the output buffer 600.

Figure 11:
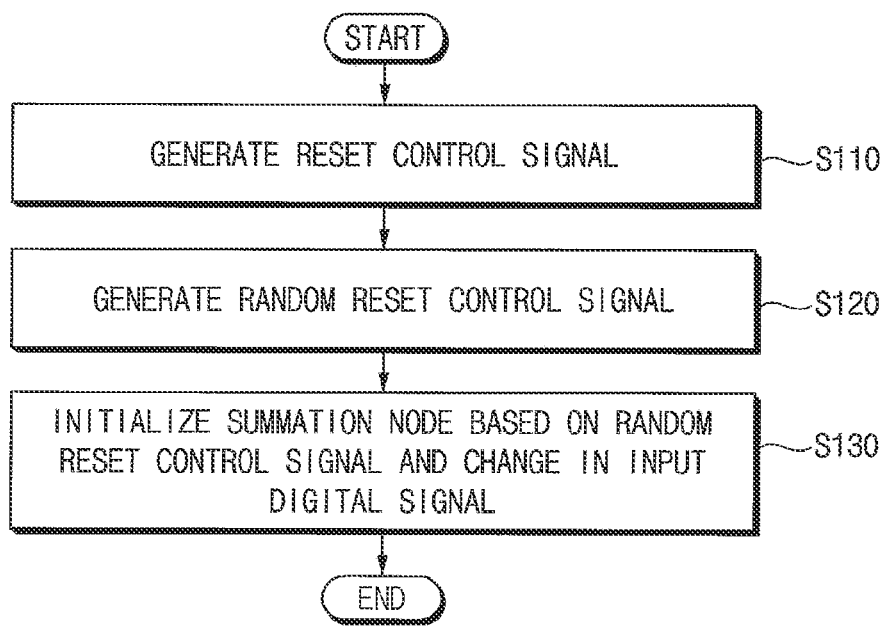
FIG. 11 is a flowchart illustrating an example of initializing a summation node in FIG. 10.

FIG. 11 is a flowchart illustrating an example of initializing a summation node in FIG. 10.

Referring to FIGS. 1, 10 and 11, when initializing the summation node NS during the reset phase 20 (step S100), the reset control signal RST that is regularly toggled may be generated based on the external clock signal ECLK (step S110). For example, step S110 may be performed by the clock generator 200, and may be performed as described with reference to FIG. 2B.

The random reset control signal RAND_RST that is irregularly toggled may be generated based on the reset control signal RST (step S120). For example, step S120 may be performed by the random reset control signal generator 300, and may be performed as described with reference to FIG. 5.

The summation node NS may be initialized based on the random reset control signal RAND_RST and the change in the input digital signal DIN (step S130). For example, step S130 may be performed by the capacitor array 400 and the reset circuit 500, and may be performed as described with reference to FIG. 7B.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 12:
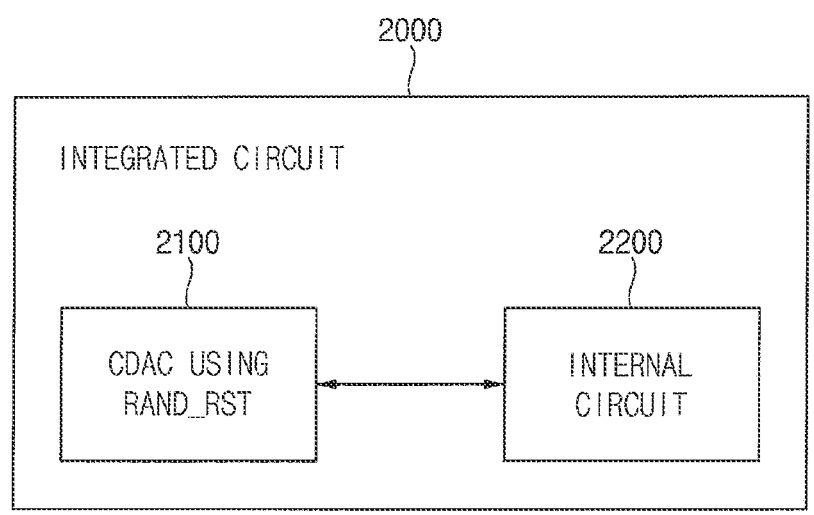
FIG. 12 is a block diagram illustrating an integrated circuit according to exemplary embodiments.

FIG. 12 is a block diagram illustrating an integrated circuit according to exemplary embodiments.

Referring to FIG. 12, an integrated circuit 2000 includes a capacitor digital-to-analog converter 2100 and an internal circuit 2200.

The capacitor digital-to-analog converter 2100 may be the capacitor digital-to-analog converter 100 according to exemplary embodiments. The capacitor digital-to-analog converter 2100 may perform a digital-to-analog conversion operation on at least one of an input and an output of the internal circuit 2200.

The capacitor digital-to-analog converter 2100 may perform the reset operation during the reset phase 20 based on the random reset control signal RAND_RST. The random reset control signal RAND_RST may be irregularly toggled during the reset phase 20, and rising edges and/or falling edges of the random reset control signal RAND_RST may be irregularly (e.g., randomly) generated. Thus, the glitches due to the reset operations may randomly occur, and a specific frequency component due to a periodic glitch may not occur. Accordingly, the glitches may be minimized while reducing the signal dependence by performing the reset operation, and the capacitor digital-to-analog converter 2100 may have improved or enhanced performance (e.g., SNR characteristic).

The internal circuit 2200 may be interoperable with the capacitor digital-to-analog converter 2100, and/or may perform other specific operations.

Figure 13:
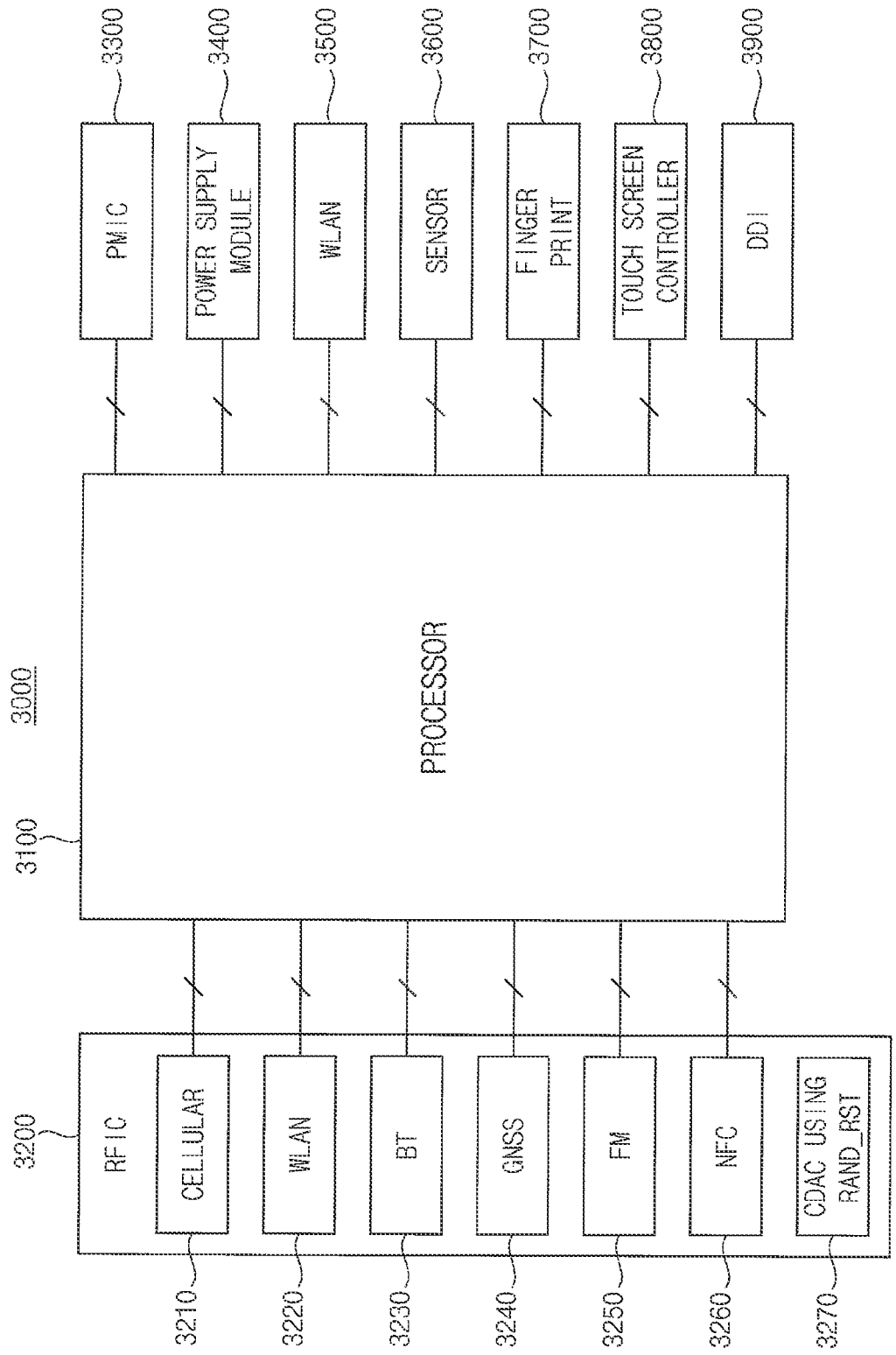
FIG. 13 is a block diagram illustrating a digital processing system according to exemplary embodiments.

FIG. 13 is a block diagram illustrating a digital processing system according to exemplary embodiments.

Referring to FIG. 13, a digital processing system 3000 may include a master device 3100 and a plurality of slave devices 3200, 3300, 3400, 3500, 3600, 3700, 3800 and 3900.

In some exemplary embodiments, the digital processing system 3000 may be any electronic system, such as a personal computer (PC), a mobile phone, a smart phone, a tablet computer, a laptop computer, a personal digital assistant (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The master device 3100 may be a controller circuit or a processor which can actively control the plurality of slave devices 3200, 3300, 3400, 3500, 3600, 3700, 3800 and 3900. For example, the master device 3100 may be implemented as a baseband modem processor chip, a chip which can function as both a modem and an application processor (AP), an AP, or a mobile AP, however, exemplary embodiments are not limited thereto.

Each of the slave devices 3200, 3300, 3400, 3500, 3600, 3700, 3800 and 3900 may be one of various circuits or devices which can passively operate based on a control of the master device 3100. For example, the slave devices 3200, 3300, 3400, 3500, 3600, 3700, 3800 and 3900 may include a radio frequency integrated circuit (RFIC) 3200, a power management integrated circuit (PMIC) 3300, a power supply module 3400, a secondary RFIC 3500, a sensor 3600, a fingerprint recognition chip 3700, a touch screen controller 1800, and a display driver integrated circuit or digital display interface (DDI) 3900.

The RFIC 3200 may include at least one connectivity chip. For example, the connectivity chip may include a chip 3210 for mobile communication, a chip 3220 for wireless local area network (WLAN) (e.g., WiFi), a chip 3230 for Bluetooth communication, a chip 3240 for global navigation satellite system (GNSS) communication, a chip 3250 for processing frequency modulation (FM) audio/video, and a chip 3260 for near field communication (NFC), however, exemplary embodiments are not limited thereto.

The RFIC 3200 may further include at least one capacitor digital-to-analog converter 3270. The capacitor digital-to-analog converter 3270 may be the capacitor digital-to-analog converter 100 according to exemplary embodiments. The capacitor digital-to-analog converter 3270 may perform the reset operation during the reset phase 20 based on the random reset control signal RAND_RST. The random reset control signal RAND_RST may be irregularly toggled during the reset phase 20, and rising edges and/or falling edges of the random reset control signal RAND_RST may be irregularly (e.g., randomly) generated. Thus, the glitches due to the reset operation may randomly occur, and a specific frequency component due to a periodic glitch may not occur. Accordingly, the glitches may be minimized while reducing the signal dependence by performing the reset operation, and the capacitor digital-to-analog converter 3270 may have improved or enhanced performance (e.g., SNR characteristic).

In some exemplary embodiments, the capacitor digital-to-analog converter 3270 may be formed to correspond to each connectivity chip.

The inventive concept may be applied to various electronic devices and systems that include the digital-to-analog converters. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of exemplary embodiments and is not to be construed as limiting thereof. Although some exemplary embodiments have been described, those skilled in the art will readily appreciate that many modifications are possible in the exemplary embodiments without materially departing from the novel teachings and advantages of such exemplary embodiments. Accordingly, all such modifications are intended to be included within the scope of the exemplary embodiments as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A capacitor digital-to-analog converter (CDAC) comprising:
    a clock generator configured to generate an internal clock signal and a reset control signal based on an external clock signal, the internal clock signal being regularly toggled, the reset control signal being regularly toggled;
    a random reset control signal generator configured to generate a random reset control signal based on the reset control signal, the random reset control signal being irregularly toggled;
    a first capacitor array including a plurality of capacitors, and configured to generate a first summation voltage based on a first reference voltage and a second reference voltage, the plurality of capacitors in the first capacitor array being connected to a first summation node and having different capacitances, the first summation voltage corresponding to a first input digital signal;
    a first reset circuit configured to initialize the first summation node based on the random reset control signal and a change in the first input digital signal; and
    an output buffer configured to generate a first analog output voltage by buffering the first summation voltage,
    wherein the capacitor digital-to-analog converter is configured to operate in a reset phase for initializing the first summation node, and during the reset phase, a value of the first input digital signal sequentially increases based on the internal clock signal.

2. The capacitor digital-to-analog converter of claim 1, wherein the random reset control signal generator includes:
    a pseudorandom number generator configured to generate a pseudorandom number signal based on the internal clock signal; and
    a logic circuit configured to generate the random reset control signal based on the pseudorandom number signal and the reset control signal.

3. The capacitor digital-to-analog converter of claim 2, wherein the logic circuit includes:
    an AND gate configured to perform an AND operation on the pseudorandom number signal and the reset control signal.

4. The capacitor digital-to-analog converter of claim 1, wherein the first reset circuit includes:
    a first switch connected between a reset voltage and the first summation node, and configured to be turned on and off based on the random reset control signal.

5. The capacitor digital-to-analog converter of claim 1, wherein:
the capacitor digital-to-analog converter is configured to operate in a conversion phase subsequent to the reset phase,
during the reset phase, the reset control signal is regularly toggled, and the random reset control signal is irregularly toggled, and
during the conversion phase, the reset control signal and the random reset control signal have a deactivation state.

6. The capacitor digital-to-analog converter of claim 5, wherein:
during a unit interval in the reset phase, a sum of lengths of first activation periods in which the reset control signal has an activation state and a sum of lengths of first deactivation periods in which the reset control signal has the deactivation state are equal to each other, and
during the unit interval in the reset phase, a sum of lengths of second activation periods in which the random reset control signal has the activation state and a sum of lengths of second deactivation periods in which the random reset control signal has the deactivation state are different from each other.

7. The capacitor digital-to-analog converter of claim 6, wherein:
during the second activation periods in the reset phase, a voltage level of the first summation voltage at the first summation node is initialized to a voltage level of a reset voltage, and
during the second deactivation periods in the reset phase, the voltage level of the first summation voltage at the first summation node sequentially increases based on the first input digital signal.

8. The capacitor digital-to-analog converter of claim 6, wherein, during the conversion phase, the first input digital signal has a target value for a digital-to-analog conversion, and the first summation voltage has a target voltage level corresponding to the target value.

9. The capacitor digital-to-analog converter of claim 1, wherein:
the plurality of capacitors in the first capacitor array include first to N-th capacitors, where N is a natural number greater than or equal to two, and
a capacitance of the N-th capacitor is 2(N−1) times a capacitance of the first capacitor.

10. The capacitor digital-to-analog converter of claim 9, wherein the first capacitor array further includes:
first to N-th switches connected to the first to N-th capacitors, and configured to provide one of the first reference voltage and the second reference voltage to the first to N-th capacitors based on bits of the first input digital signal.

11. The capacitor digital-to-analog converter of claim 1, further comprising:
a reference voltage generator configured to generate the first reference voltage.

12. The capacitor digital-to-analog converter of claim 11, wherein the reference voltage generator includes:
an amplifier including a first input terminal receiving an input voltage, a second input terminal connected to a first node, and an output terminal;
a transistor connected between a power supply voltage and a second node outputting the first reference voltage, and including a control electrode connected to the output terminal of the amplifier;
a first resistor connected between the second node and the first node;
a second resistor connected between the first node and a ground voltage; and
a decoupling capacitor connected between the second node and the ground voltage.

13. The capacitor digital-to-analog converter of claim 12, wherein the second reference voltage is a ground voltage.

14. The capacitor digital-to-analog converter of claim 1, further comprising:
a decoder logic circuit configured to generate the first input digital signal based on the internal clock signal.

15. The capacitor digital-to-analog converter of claim 1, further comprising:
a second capacitor array including a plurality of capacitors, and configured to generate a second summation voltage based on the first reference voltage and the second reference voltage, the plurality of capacitors in the second capacitor array being connected to a second summation node and having different capacitances, the second summation voltage corresponding to a second input digital signal; and
a second reset circuit configured to initialize the second summation node based on the random reset control signal and a change in the second input digital signal, and
wherein the output buffer is configured to generate the first analog output voltage and a second analog output voltage by buffering the first summation voltage and the second summation voltage.

16. The capacitor digital-to-analog converter of claim 15, wherein the first analog output voltage and the second analog output voltage are a pair of differential signals.

17. The capacitor digital-to-analog converter of claim 15, wherein the second input digital signal is obtained by inverting the first input digital signal.

18. The capacitor digital-to-analog converter of claim 1, wherein a phase of the internal clock signal and a phase of the reset control signal are opposite to each other.

19. An integrated circuit comprising:
an internal circuit; and
a capacitor digital-to-analog converter (CDAC) configured to perform a digital-to-analog conversion on at least one of an input and an output of the internal circuit, and
wherein the capacitor digital-to-analog converter includes:
a clock generator configured to generate an internal clock signal and a reset control signal based on an external clock signal, the internal clock signal being regularly toggled, the reset control signal being regularly toggled;
a random reset control signal generator configured to generate a random reset control signal based on the reset control signal, the random reset control signal being irregularly toggled;
a first capacitor array including a plurality of capacitors, and configured to generate a first summation voltage based on a first reference voltage and a second reference voltage, the plurality of capacitors in the first capacitor array being connected to a first summation node and having different capacitances, the first summation voltage corresponding to a first input digital signal;

a first reset circuit configured to initialize the first summation node based on the random reset control signal and a change in the first input digital signal; and an output buffer configured to generate a first analog output voltage by buffering the first summation voltage, wherein the capacitor digital-to-analog converter is configured to operate in a reset phase for initializing the first summation node, and during the reset phase, a value of the first input digital signal sequentially increases based on the internal clock signal.

20. A capacitor digital-to-analog converter (CDAC) comprising:

a clock generator configured to generate an internal clock signal and a reset control signal based on an external clock signal, the internal clock signal being regularly toggled during a reset phase and a conversion phase, the reset control signal being regularly toggled during the reset phase and having a deactivation state during the conversion phase;

a random reset control signal generator configured to generate a random reset control signal based on the internal clock signal and the reset control signal, the random reset control signal being irregularly toggled during the reset phase and having the deactivation state during the conversion phase;

a capacitor array configured to generate a summation voltage corresponding to an input digital signal based on a reference voltage and a ground voltage, the capacitor array including:

first to N-th capacitors connected to a summation node and having different capacitances, where N is a natural number greater than or equal to two; and first to N-th switches connected to the first to N-th capacitors;

a reference voltage generator configured to generate the reference voltage, and including a decoupling capacitor;

a decoder logic circuit configured to generate the input digital signal based on the internal clock signal;

a reset circuit configured to initialize the summation node based on a reset voltage, the random reset control signal and a change in the input digital signal during the reset phase; and an output buffer configured to generate an analog output voltage by buffering the summation voltage, wherein, during the reset phase, a value of the input digital signal sequentially increases based on the internal clock signal, a voltage level of the summation voltage is initialized to a voltage level of the reset voltage in response to the random reset control signal having an activation state, and the voltage level of the summation voltage sequentially increases based on the input digital signal in response to the random reset control signal having the deactivation state, and wherein, during the conversion phase, the input digital signal has a target value for a digital-to-analog conversion, and the summation voltage has a target voltage level corresponding to the target value.

* * * * *